(12) United States Patent
Engle

(10) Patent No.: US 8,061,299 B2
(45) Date of Patent: Nov. 22, 2011

(54) FORMATION OF PHOTOCONDUCTIVE AND PHOTOVOLTAIC FILMS

(76) Inventor: George M. Engle, Scottsdale, AZ (US)

( * ) Notice: Subject to any disclaimer, the term of this patent is extended or adjusted under 35 U.S.C. 154(b) by 0 days.

(21) Appl. No.: 11/059,981

(22) Filed: Feb. 17, 2005

(65) Prior Publication Data

US 2005/0178329 A1  Aug. 18, 2005

Related U.S. Application Data

(60) Provisional application No. 60/545,249, filed on Feb. 17, 2004.

(51) Int. Cl.
  C23C 16/50 (2006.01)
  C23C 16/503 (2006.01)
  C23C 16/505 (2006.01)
  C23C 16/509 (2006.01)
  C23C 16/52 (2006.01)
  H01L 21/306 (2006.01)
  C23F 1/00 (2006.01)
  C23C 16/06 (2006.01)
  C23C 16/22 (2006.01)

(52) U.S. Cl. ............... 118/723 E; 118/723 R; 118/666; 118/663; 204/298.01; 156/345.43; 156/345.44

(58) Field of Classification Search .............. 118/723 R, 118/723 E, 666, 663; 204/298.01; 156/345.43, 156/345.44
See application file for complete search history.

(56) References Cited

U.S. PATENT DOCUMENTS

| | | | |
|---|---|---|---|
| 2,997,409 A | 8/1961 | McLean | |
| 3,121,023 A | 2/1964 | Spenser | |
| 3,178,312 A | 4/1965 | Johnson | |
| 3,716,424 A | 2/1973 | Schoolar | |
| 3,968,360 A | 7/1976 | Monnier | |
| 4,157,926 A | 6/1979 | Schoolar | |
| 4,299,678 A * | 11/1981 | Meckel | 204/192.2 |
| 4,312,114 A | 1/1982 | Schoolar | |
| 4,689,246 A | 8/1987 | Barrett | |
| 4,715,319 A * | 12/1987 | Bringmann et al. | 118/723 E |
| 4,721,664 A * | 1/1988 | Shimizu et al. | 430/128 |
| 5,009,743 A * | 4/1991 | Swann | 216/66 |
| 5,275,839 A | 1/1994 | Smith | |
| 6,296,711 B1 * | 10/2001 | Loan et al. | 118/726 |
| 6,444,103 B1 * | 9/2002 | Moslehi et al. | 204/298.11 |
| 6,509,066 B1 | 1/2003 | Jost | |

FOREIGN PATENT DOCUMENTS

JP  08302464 A  * 11/1996

* cited by examiner

Primary Examiner — Rudy Zervigon
(74) Attorney, Agent, or Firm — The von Hellens Law Firm, Ltd.

(57) ABSTRACT

A deposition system includes a vacuum reaction chamber with a substrate holder positioned in it. The substrate holder is for carrying a substrate therein. A sputtering apparatus is also positioned in the vacuum reaction chamber. The sputtering apparatus is configured to direct sputtered material towards the substrate to form a sputtered material region thereon. A plasma enhanced chemical vapor deposition (PECVD) apparatus is positioned in the vacuum reaction chamber. The PECVD apparatus is configured to deposit a PECVD material region thereon the substrate. The first PECVD apparatus includes a first PECVD electrode movable from a first position towards the substrate and a second position away from the substrate.

27 Claims, 9 Drawing Sheets

FORMATION OF PHOTOCONDUCTIVE AND PHOTOVOLTAIC FILMS

CROSS REFERENCES TO RELATED APPLICATIONS

This application claims the benefit of provisional application Ser. No. 60/545,249, which was filed on Feb. 17, 2004.

FIELD OF THE INVENTION

The present invention relates to systems and methods for depositing material regions onto substrates.

BACKGROUND OF THE INVENTION

The use of lead salt materials, such as lead sulfide (PbS), lead selenide (PbSe), and lead telluride (PbTe), in photoconductive and photovoltaic applications is well known in the art. Lead salt materials have band gap energies which allow the absorption of radiation in the infrared spectrum. In photoconductive applications, the absorption of infrared radiation by the lead salt material provides a change in its conductivity. The change in the conductivity can be sensed by sensing a current flowing therethrough. In this way, the lead salt material can be used to sense incident radiation. In photovoltaic applications, the absorption of infrared radiation in the lead salt material provides a potential difference. The potential difference can be used to provide electrical power. Accordingly, lead salt materials can be used in optoelectronic devices such as infrared photodetectors, solar cells, and thermoelectric devices, among others.

Typically, lead salt materials are deposited on a substrate, such as a silicon substrate, by evaporation or chemical bath deposition. However, these deposition methods have several problems. One problem is that the deposited lead salt material may not adhere to the substrate properly. This is particularly a problem if the substrate is silicon. If the lead salt material does not adhere properly, then the yield of devices is low, which increases the costs.

Another problem is that it is difficult to control the composition of the deposited lead salt material. As a result, the composition of the lead salt material tends to be different from one deposition to another. This is further complicated because the composition can undesirably change with time after it is deposited and exposed to the outside atmosphere. The electrical and/or optical properties of the lead salt material depends on the composition, so if the composition changes then these will too.

A further problem is that it is typically desired to sensitize the lead salt material. After it is sensitized, the lead salt material is sensitive to incident IR radiation at higher temperatures, such as room temperature. Sensitization is usually done by exposing the lead salt material to oxygen. The sensitization can be characterized by measuring the resistivity of the lead salt material. However, the sensitization of lead salt material regions using conventional methods often leads to undesirable differences in resistivity from one lead salt material region to another.

These problems limit the usefulness of any devices formed with lead salt materials fabricated using conventional deposition systems and methods. Hence, there is a need for better systems and methods for depositing lead salt material regions onto substrates.

SUMMARY OF THE INVENTION

The present invention provides a deposition system which includes a vacuum reaction chamber with a substrate holder positioned in it. A first sputtering apparatus and a first plasma enhanced chemical vapor deposition (PECVD) apparatus are also positioned in the vacuum reaction chamber. In one example, the substrate holder holds a substrate. Since the first sputtering apparatus is configured to direct sputtered material towards the substrate holder, the sputtered material will be deposited on the substrate to form a sputtered material region thereon. The first PECVD apparatus is configured to deposit a PECVD material region thereon the substrate or the sputtered material region. It should be noted that a material region can include one or more layers of the same or different materials. Further, each layer can include an alloy of a material which includes two or more different elements in various compositions.

The first PECVD apparatus includes a first PECVD electrode movable from a first position towards the substrate holder and a second position away from the substrate holder. In the first position, the first electrode can provide a plasma near the substrate holder in response to a potential difference between the first electrode and substrate holder. The first PECVD apparatus can also include a gas line which provides at least one of oxygen gas and halogen gas to sensitize the material region that has been sputtered onto the substrate with the first sputtering apparatus.

The deposition system can further include a second sputtering apparatus positioned in the vacuum reaction chamber. The second sputtering apparatus is configured to direct sputtered material towards the substrate holder so that it is deposited on the substrate. In some embodiments, the first sputtering apparatus can include a first target of a first lead salt material and the second sputtering apparatus can include a second target of a second lead salt material. Hence, lead salt material regions which include two different lead salt materials can be sputtered onto the substrate. The two different lead salt materials can be sputtered sequentially to provide two separate lead salt regions positioned on top of each other or they can be sputtered at the same time to form a material region which includes a lead salt alloy.

The deposition system can also include a second PECVD apparatus positioned in the vacuum reaction chamber. The second PECVD apparatus is configured to deposit a second PECVD material region thereon the substrate. The second PECVD apparatus includes a second PECVD electrode movable from a first position towards the substrate holder and a second position away from the substrate holder.

The present invention further provides a deposition system which includes a vacuum reaction chamber with a substrate holder positioned in it. The substrate holder is configured to hold a substrate. A sputtering apparatus is also positioned in the reaction chamber. The sputtering apparatus includes a first target and a first electrode coupled to it. The first target can include lead salt material. A first gas line provides a sputtering gas into the reaction chamber. The first gas line can be positioned to output the sputtering gas toward the first target. The sputtering gas impacts the first target to sputter portions of the first target onto the substrate in response to a potential difference between the first electrode and the substrate.

A plasma enhanced chemical vapor deposition (PECVD) apparatus is also positioned in the reaction chamber. The PECVD apparatus includes a second electrode movable between a first position between the first target and substrate and a second position away from the first target and substrate. A plasma is formed between the second electrode and the substrate when the second electrode is in the first position. A second gas line provides a process gas into the reaction chamber so that it can be decomposed into reactant gases by the plasma. The second gas line can be positioned to output the process gas toward the substrate so that it reacts with the substrate more efficiently.

The deposition system can include a second sputtering apparatus with a second target positioned near the first target and a third electrode coupled to the second target. The sputtering gas impacts the second target sputtering portions of the second target onto the substrate in response to a potential difference between the third electrode and substrate. The first target can include a first lead salt material and the second target can include a second lead salt material. The first lead salt material can be the same or different from the second lead salt material.

The deposition system can include a second PECVD apparatus with a fourth electrode movable from a first position between the second target and substrate and a second position away from the second target and substrate. The first and second targets and the second and fourth electrodes can be oriented at non-zero angles relative to the substrate.

The deposition system can include an iodine gas source coupled to the second gas line. The iodine gas source can include a container with solid iodine positioned in it. A heater is positioned to heat the solid iodine forming an iodine gas. A temperature control system is coupled to the container to monitor the temperature of the iodine gas. A pressure control system is also coupled to the container to monitor a pressure of the iodine gas inside the container. A container gas outlet is positioned to allow an amount of the iodine gas in the container to flow to the second gas line. The temperature control system adjusts the amount of heat provided by the heater in response to a feedback signal provided by the pressure control system. The feedback signal indicates the pressure of the iodine gas in the container. In this way, the temperature and pressure of the iodine gas can be controlled so that the amount of iodine gas is flowed through the second gas line.

The present invention further provides a deposition system with a substrate transfer housing having a plurality of openings. A door is coupled to each opening of the substrate transfer housing. Each door is movable between a first position away from the substrate transfer housing and a second position enclosing the substrate transfer housing. A substrate holder chamber is coupled to at least one opening of the substrate transfer housing. At least one sputter deposition system and at least one plasma enhanced chemical vapor deposition (PECVD) system are also coupled to at least one opening of the substrate transfer housing. In this way, a substrate can be transferred between the at least one sputter deposition system and the at least one PECVD system without undesirably exposing the substrate to the outside atmosphere between depositions.

The present invention also provides a method of depositing a lead salt material region. The method includes providing a reaction chamber and positioning a substrate and a lead salt sputtering target into it. A sputtering gas is provided into the reaction chamber and a pressure is provided therein. The step of providing the sputtering gas can also include providing a reactant gas into the reaction chamber. The reactant gas can include at least one of a sensitizing gas and a dopant gas. A portion of a first lead salt sputtering target is sputtered onto the substrate to form a first sputtered material region. In some embodiments, the method can include a step of depositing a seal coating material region on the first sputtered material region.

The method can include an optional step of sputtering a portion of a second lead salt sputtering target onto the first lead salt material region to form a second sputtered material region thereon. In some embodiments, the method includes a step of adjusting a temperature of the substrate between the steps of sputtering the first sputtered material region and forming the sensitized material region. The method can also include an optional step of sensitizing the first sputtered material region using one of sputtering and PECVD to form a sensitized material region.

These and other features, aspects, and advantages of the present invention will become better understood with reference to the following drawings, description, and claims.

BRIEF DESCRIPTION OF THE DRAWINGS

Referring to the drawings.

DETAILED DESCRIPTION OF A PREFERRED EMBODIMENT

Figure 1:
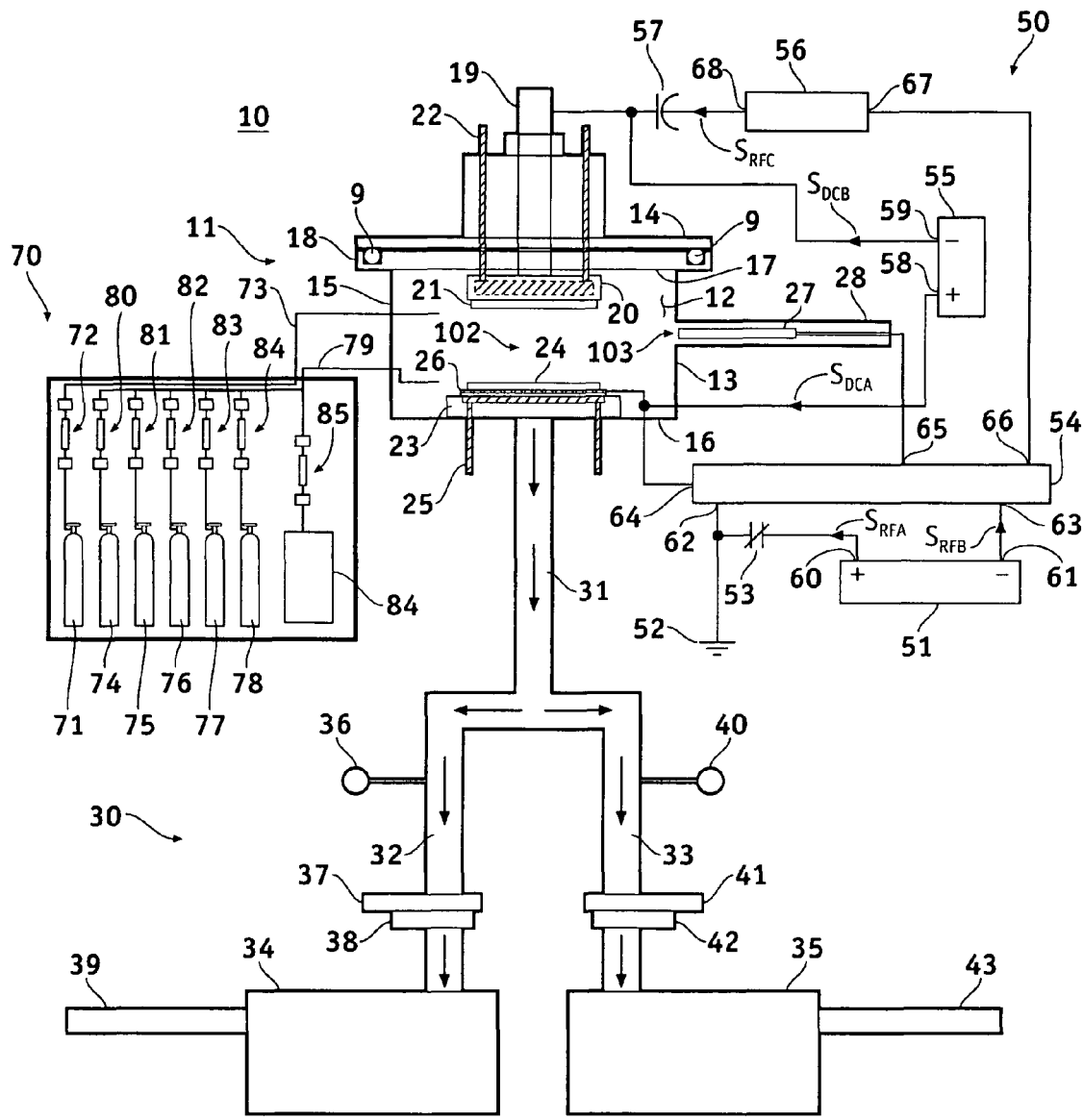
FIG. 1 is a simplified diagram of a deposition system in accordance with the present invention.

Turning now to the drawings, in which like reference characters indicate corresponding elements throughout the several views, attention is first directed to FIG. 1 which shows a simplified diagram of a deposition system 10 in accordance with the present invention. Deposition system 10 allows the deposition of separate material regions onto a substrate by sputtering and plasma enhanced chemical vapor deposition (PECVD) without undesirably exposing them to the outside atmosphere in between depositions.

Some of the material regions can include lead salt materials such as lead sulfide (PbS), lead selenide (PbSe), and lead telluride (PbTe). However, the material regions can also include semiconductor materials such as silicon (Si), silicon oxide (SiO), or silicon nitride (SiN), among others. It should be noted that a region can include one or more layers of the same or different materials. Further, each layer can include an alloy of a material which includes two or more different elements in various compositions. For example, a material region can include $Pb_{0.55}S_{0.45}$, silicon oxynitride (SiON), or other alloys known in the art.

In accordance with the invention, the lead salt or some of the other material regions are deposited using sputtering. Sputtering is a term used to describe the mechanism in which atoms are dislodged from a surface of a target by collision with high-energy ions or particles. The sputtering of the lead salt materials is typically done with RF sputtering in which the high-energy ions or particles are generated in response to a sputtering signal which varies with time. The sputtering signal can also include a signal which is substantially constant with time in addition to the time varying signal (i.e. bias sputtering). In some embodiments, the sputtering can be done in the presence of a magnetic field (i.e. magnetron sputtering).

These methods of sputtering and others are well known to those skilled in the art and will not be elaborated upon further here.

One reason the lead salt material regions are sputtered is so that they adhere to the substrate better. This improves the reliability and yield of any devices formed therewith. Another reason the lead salt material regions are sputtered is because various reactants can be incorporated in situ (i.e. reactive sputtering). For example, the reactants can include dopants which make the lead salt material region p-type or n-type when incorporated therein. The reactants can also include oxygen, which sensitizes the lead salt material region. The exposure of the lead salt material region to oxygen can take place with or without the presence of a halogen gas. Halogen gases typically include iodine, fluorine, bromide, and chlorine. When the lead salt material region is sensitized, it is sensitive to incident IR radiation at higher temperatures, such as room temperature. The sensitization can be characterized by measuring the resistivity of the lead salt material. The lead salt material regions can be sensitive to IR radiation at low temperatures, but it is generally desired to have the lead salt material region be sensitive to IR radiation at higher temperatures. This is because it is expensive and inconvenient to provide low temperatures.

In some embodiments, the sputtered lead salt material region is coated with a seal coating material region. This is typically done after the lead salt material region has been sensitized and before it is exposed to the outside atmosphere. The seal coating material region is chosen to protect the lead salt material region from the outside atmosphere when the substrate is removed from deposition system 10. The outside atmosphere can undesirably change the optical and/or electrical properties of the lead salt material region.

Since sputtering and PECVD are used to form the various material regions, these material regions have more consistent electrical and/or optical properties from one deposition to another. This is because deposition system 10 allows the controllability of the amount and type of elements the lead salt material region is exposed too before the seal coating material region is deposited thereon. For example, the amount of oxygen can be better controlled as well as its temperature because the depositions occur in a controlled environment in a reaction chamber and not in the outside atmosphere where undesired elements may be present. The seal coating material region stabilizes the electrical and/or optical properties as a function of time because it is chosen to include a material which is impermeable by the outside atmosphere. In this way, undesired elements from the outside atmosphere are less likely to attach to the sensitized lead salt material region and undesirably alter its properties.

In this embodiment, deposition system 10 includes a vacuum reaction chamber 11 with a chamber space 12 defined by a housing 13 and a lid 14. Housing 13 is generally cylindrical in shape with sidewall 15, although it can have other shapes. A bottom parametric edge of sidewall 15 is coupled to a bottom wall 16 and a top parametric edge is defined by an opening 17. A lip 18 extends outwardly around the periphery of the top parametric edge of sidewall 15 so that it receives lid 14.

Lid 14 encloses chamber space 12 when it is positioned on lip 18. In this way, lid 14 can be moved between an open position to allow access to chamber space 12 and a closed position enclosing chamber space 12. In the closed position, lid 14 forms a seal with lip 18 so that a pressure in chamber space 12 can be controlled. The seal is facilitated by the positioning of an O-ring 9 which extends around the periphery of lip 18. When lid 14 is in its closed position, a vacuum can be formed within chamber space 12.

In accordance with the invention, an electrode 19 extends through lid 14 and into chamber space 12. A target holder 20 is coupled to electrode 19 so that it is held within space 12. A target 21 is carried by target holder 20 so that it faces downwardly towards bottom wall 16. A cooling line 22 extends through lid 14 and into chamber space 12. Inside space 12, cooling line 22 extends through target holder 20 and then back out of chamber space 12 through lid 14.

A substrate holder 23, which carries a substrate 24, is positioned in chamber space 12 near bottom wall 16 so that they both face upwards towards target 21. In some examples and the others discussed herein, substrate holder 23 can rotate so that the materials deposited on substrate 24 are more uniform. Substrate 24 can include a semiconductor material, such as silicon, or another material onto which it is desired to deposit a lead salt or other material regions. This is particularly useful because conventional deposition methods provide lead salt material regions which adhere poorly to a silicon substrate. Good adhesion of the lead salt material to the silicon substrate allows the fabrication of improved device structures with better yields. This provides better device performance and reduces manufacturing costs.

For example, in a photovoltaic device, the silicon substrate can have one conductivity type and the sputtered lead salt material region can have an opposite conductivity type so that a pn junction is formed therebetween. The lead salt material region is sensitized so that this particular structure can be used as an efficient and cost effective solar cell. One factor which determines its efficiency is the adhesion between the lead salt material region and the silicon substrate. This is because the interface between them is the pn junction. As a result, if the adhesion is poor, then there will be more defects in the pn junction which decreases its efficiency.

In an example of a photoconductive device, the silicon substrate can have an insulating region positioned on its surface onto which the lead salt material region is sputtered. The insulating region can include silicon oxide, silicon nitride, or another insulator which reduces the current flow between the lead salt material region and substrate. The lead salt material region is sensitized and separate contacts are made to the lead salt material region so the current flowing therebetween can be sensed through the separate contacts. Since the current depends on radiation incident to the lead salt material region, this particular structure can be used as an efficient and cost effective photodetector.

A heater 26 is positioned near substrate 24 to heat it up. Here, heater 26 is positioned between substrate 24 and substrate holder 23, although in some examples, heater 26 can be otherwise positioned. For example, in some embodiments, heater 26 can be integrated with substrate holder 23. A cooling line 25 extends through bottom wall 16 and into chamber space 12. Inside space 12, cooling line 25 extends through substrate holder 23 and then back out of chamber space 12 through bottom wall 16.

Target holder 20 is thermally coupled to target 21 and substrate holder 23 is thermally coupled to substrate 24 through heater 26 so that cooling lines 22 and 25 can flow a coolant therethrough to adjust the temperature of target 21 and substrate 24, respectively. The coolant typically includes water, such as process chilled water, although it can include other coolants. Hence, cooling line 25 can be used to reduce the temperature of substrate 24 to below room temperature and heater 26 can be used to increase the temperature of substrate 24 to above room temperature.

It should be noted that the configuration of chamber 11 can be different than that shown in FIG. 1. For example, chamber 11 can be turned upside down so that material from target 21 is sputtered upwards instead of downwards. One advantage of this configuration is that it is less likely for substrate 24 to become contaminated.

In accordance with the invention, an electrode 27 is positioned within reaction chamber 11. Electrode 27 is movable between a position between target 21 and substrate 24 in an area 102 and a position away from target 21 and substrate 24 in an area 103. In this particular example, when electrode 27 is in area 103 away from target 21 and substrate 24, it is positioned in an electrode chamber 28. Electrode chamber 28 is coupled to sidewall 15 so that it opens up into chamber space 12. In this way, electrode 27 can be extended into or out of chamber space 12.

In FIG. 1, electrode 27 is shown in its retracted position where it is in area 103 in electrode chamber 28. It should be noted, however, that electrode 27 is generally movable between a position within chamber space 12 where it can be used to deposit a material region onto substrate 24 using PECVD and a different position where it does not interfere with the sputter deposition of material onto substrate 24. Accordingly, the particular movement of electrode 27 between areas 102 and 103 shown in FIG. 1 is for illustrative purposes. Hence, in other embodiments, electrode 27 can be moved to other positions where it does not interfere with the sputtering. For example, electrode 27 can be moved between area 102 and a position near sidewall 15 when it is desired to sputter.

In this embodiment, a vacuum system 30 is coupled to chamber 11 to control the pressure of the atmosphere in chamber space 12 and to outgas the gas and particles included therein. Vacuum system 30 includes a vacuum hose 31 with an end coupled with chamber space 12 through bottom wall 16. An opposed end of vacuum hose 31 is coupled to ends of a vacuum hose 32 and a vacuum hose 33 to form a three-way intersection. An opposed end of vacuum hose 32 is coupled to a mechanical pump 34 and an opposed end of vacuum hose 33 is coupled to a turbo pump 35. A pressure sensor 36 is coupled to vacuum hose 32 and indicates the pressure of the atmosphere included therein. A shut off valve 37 and a throttle valve 38 are also positioned within hose 32. Valves 37 and 38 can be opened to allow the atmosphere within chamber 11 to flow from chamber space 12 through vacuum hoses 31 and 32, and through mechanical pump 34, where it is outgassed through an outlet 39 coupled to mechanical pump 34. Valves 37 and 38 can also be closed to isolate mechanical pump 34 from vacuum hose 31.

A pressure sensor 40 is coupled to vacuum hose 33 and indicates the pressure of the atmosphere included therein. A shut off valve 41 and a throttle valve 42 are positioned within hose 33. Valves 42 and 43 can be opened to allow the atmosphere within chamber 11 to flow from chamber space 12 through vacuum hoses 31 and 33, and through turbo pump 35, where it is outgassed through an outlet 43 coupled to turbo pump 35. Valves 41 and 42 can also be closed to isolate turbo pump 35 from vacuum hose 31.

When it is desired to have mechanical pump 34 communicate with chamber space 12, valves 37 and 38 are open and valves 41 and 42 are closed so that turbo pump 35 is isolated from vacuum hose 31. Mechanical pump 34 is typically used to reduce the pressure of the atmosphere in chamber space 12 from pressures around atmospheric pressure to lower pressures. To reduce the pressure of the atmosphere within chamber space 12 to even lower pressures, turbo pump 35 is used. In this case, valves 37 and 38 are closed and valves 41 and 42 are opened so that turbo pump 35 is in communication with chamber space 12 through vacuum hose 31 and mechanical pump 34 is isolated from it.

In this embodiment, deposition system 10 includes an electrical system 50 to provide the various electrical signals for sputtering and PECVD. Electrical system 50 includes an RF power supply 51 and a DC power supply 55. RF power supply 51 typically provides time varying electrical signals, such as alternating current (AC) signals, and DC power supply 55 typically provides electrical signals, which are substantially constant in time, such as direct current (DC) signals.

In this particular example, RF power supply 51 provides an RF signal $S_{RFA}$ and an RF signal $S_{RFB}$ from outputs 60 and 61, respectively. Similarly, DC power supply 55 provides a DC signal $S_{DCA}$ and a DC signal $S_{DCB}$ from outputs 58 and 59, respectively. Output 58 of DC power supply 55 is coupled to heater 26 and output 59 of DC power supply 55 is coupled to electrode 19. Signals $S_{DCA}$ and $S_{DCB}$ are provided to heater 26 and electrode 19, respectively, to provide a DC potential difference between them. The value of the DC potential difference can be used to control various properties of the sputtered lead salt material region. These properties can include the grain size, resistivity, surface roughness, impurity concentration, and alloy composition, among others.

Output 60 of RF power supply 51 is coupled to a current return 52 and an input 62 to an RF transfer switch 54 through a variable capacitor 53. Output 61 of RF power supply 51 is coupled to an input 63 of RF transfer switch 54. RF transfer switch 54 has separate outputs 64, 65, and 66 coupled to heater 26, electrode 27, and an input 67 of an impedance matching network 56, respectively. RF transfer switch 54 is configured to provide desired signals from RF power supply 51 to heater 26, electrode 27, and impedance matching network 56 depending on the desired operation of reaction chamber 11, as will be discussed in more detail below. The particular signals outputted by RF transfer switch 54 can be controlled in many different ways. For example, a computer control system (not shown) can be coupled to switch 54 to control the signals outputted at a particular time.

It should be noted that heater 26 is used as an electrode in this embodiment for illustrative purposes. However, in other embodiments, substrate 24, substrate holder 23, or another conductive structure near substrate 24 can operate as the electrode so that an electric field can be provided between target 21 and substrate 24. In general, however, substrate 24, substrate holder 23, and heater 26 are electrically coupled together so that they are at substantially the same potential.

Input 67 of impedance matching network 56 receives a signal from output 66 of RF transfer switch 54 and conditions it to provide a signal with a certain amount of power at an output 68. This conditioned signal is provided to electrode 19 through a capacitor 57 coupled therebetween. In this way, impedance matching network 56 is configured to condition signal $S_{RFB}$ and provide a conditioned signal $S_{RFC}$ so that a desired amount of power is transferred between RF power supply 51 and electrode 19. Capacitor 57 is positioned between electrode 19 and output 68 of network 56 so that the signal from output 59 of DC power supply 55 does not flow into output 68 of network 56.

Deposition system 10 also includes a gas system 70 which provides sputtering, process, and/or reactant gases to vacuum reaction chamber 11. Gas system 70 includes a gas bottle 71 coupled to a gas line 73 through a valve system 72. System 70 further includes an iodine gas source 110 coupled to a gas line 79 through a valve system 85. Gas system 70 also includes gas bottles 74-78 coupled to gas line 79 through respective valve systems 80-84. When valve systems 80-84 are open, the gas in their corresponding gas bottles 74-78 can flow into gas line 79 and when valve systems 80-84 are closed, then the gas in their corresponding gas bottles 74-78 is blocked from flowing into gas line 79. Valve systems 80-84 are also configured to prevent any gas in gas line 79 from undesirably flowing into corresponding gas bottles 74-78. In this way, valve systems 80-84 operate as one-way valves. Valve system 72 operates as a one-way valve in a similar manner.

Gas bottle 71 typically includes a sputtering gas, such as argon (Ar), neon (Ne), or another gas typically used in sputter deposition. Gas line 73 is coupled to chamber space 12 through sidewall 15 and positioned so that the sputtering gas is flowed towards target 21 so that more of it is ionized during the sputter deposition. Gas bottles 74-78 typically include process gases. The process gases can include reactant gases typically used in the deposition of material regions. These gases can include gases used for growth, such as silane, nitrous oxide, or ammonia, among others. These gases can also include gases used for doping, such as phosphine ($PH_3$) for n-doping or diborane ($B_2H_6$) for p-doping, and/or gases for sensitization, such as oxygen gas or halogen gas. Other dopant gases include trimethylphosphite (TMP) and trimethylborate (TMB). Gas line 79 is coupled to chamber space 12 through sidewall 15 and positioned so that the process gases are flowed towards substrate 24 so that more of it reacts with substrate 24 during PECVD.

In this embodiment, deposition system 10 sputters the lead salt material region by using RF sputtering. For RF sputtering, RF power supply 51 provides a time varying potential difference between electrode 19 and heater 26 by providing values for $S_{RFA}$ and $S_{RFB}$ to electrodes 19 and 27 and heater 26 with RF power switch 54. Here, switch 54 outputs signal $S_{RFB}$ to input 67 of impedance matching network 56 where it is conditioned to provide a signal $S_{RFC}$ from output 68 to electrode 19. Switch 54 also outputs signal $S_{RFA}$ at output 64 to heater 26. Signal $S_{RFA}$ is made to be an RF ground by current return 52 so that there is a time varying potential difference between electrode 19 and heater 26. It should be noted that signal $S_{RFA}$ can be another reference potential chosen so that electrode 19 operates as a cathode and heater 26 operates as an anode. In sputter deposition with system 10, electrode 27 is typically provided with signal $S_{RFA}$ so that its potential is defined by current return 52. However, the potential of electrode 27 can be other values which make it electrically inactive during the sputter deposition.

When a sputtering gas is introduced into chamber space 12 through gas line 73, the sputtering gas is ionized by the potential difference between electrode 19 and heater 26 and the ions are directed towards target 21. When the ions collide with target 21, material from target 21 is ejected towards substrate 24 where it forms a region of material thereon. In this way, deposition system 10 provides sputter deposition onto substrate 24. It should be noted that the sputter deposition onto substrate 24 can take place directly on substrate 24 or it can take place on a material region previously deposited thereon. It should also be noted that in other embodiments, the sputtering of target 21 can be done with an ion gun (not shown) which emits a stream of particles at target 21. Hence, the use of sputtering gas ions in this embodiment is for illustrative purposes.

The properties of a sputtered lead salt material region can be controlled in several ways during the sputter deposition. For example, the adhesion of the sputtered lead salt material region can be controlled by controlling the power output of RF power supply 51 and DC power supply 55. The adhesion of the sputtered lead salt material region can also be controlled by controlling the pressure of the sputtering gas within chamber space 12. The pressure of the sputtering gas within chamber space 12 can be controlled by controlling its flow rate through gas line 73 by adjusting valve system 72.

The temperature of target 21 can also affect the properties of the sputtered lead salt material region. The temperature of target 21 can be controlled by adjusting the temperature and/or flow rate of the coolant flowing through cooling line 22. Likewise, the temperature of substrate 24 can affect the properties of the sputtered lead salt material region. The temperature of substrate 24 can be controlled by controlling the flow rate and/or temperature of the coolant flowing through cooling line 25 and the temperature of any heat provided by heater 26. The temperature of substrate 24 affects the properties of the sputtered lead salt material region since they are thermally coupled together. These properties can include the resistivity, grain size, composition, and stress, among other properties.

In accordance with the invention, deposition system 10 also provides plasma enhanced chemical vapor deposition, in addition to sputter deposition, to deposit a PECVD material region onto substrate 24. It should be noted that the deposition of the PECVD material region can take place directly onto substrate 24 or it can take place on another material region previously deposited onto substrate 24. For example, the PECVD material region can be deposited onto the sputtered lead salt material region discussed above. The elements included in the PECVD material region can be chosen to sensitize the sputtered lead salt material region.

Conventional CVD involves the formation of a non-volatile solid film on a substrate by the reaction of vapor phase gases (reactants) that include the desired chemical constituents. The reactant gases are introduced into a reaction chamber from a gas line and are decomposed and reacted at a heated surface of a substrate. However, in PECVD, a plasma is used to transfer energy to the reactant gases so that they decompose in response to the plasma instead of the heated surface of the substrate. In this way, the deposition of the PECVD material region can be done at much lower temperatures because the substrate does not have to be heated up to cause the reaction.

One way PECVD is provided by deposition system 10 is in the following manner. The sputtering gas from gas line 73 is turned off and the process gases from gas line 79 is turned on so that the process gases flows into chamber 11. Although the sputtering gas is turned off in this example, it can be left on in other examples to improve the uniformity of the PECVD material region. The process gases includes the reactant gases and its pressure is typically chosen so that the plasma more easily ionizes them. The plasma is generated by extending electrode 27 out from chamber 28 so that it is positioned between target 21 and substrate 24 in area 102. A potential difference is provided between electrode 27 and heater 26 so that the plasma is formed therebetween. Since it is desired in this example to use PECVD to deposit the material region onto substrate 24, signal $S_{RFB}$ is provided to electrode 27 by output 65 of RF power switch 54. Switch 54 also provides signal $S_{RFA}$ from output 64 to heater 26 so that there is a potential difference between electrode 27 and heater 26 which provides the plasma therebetween.

The plasma creates free electrons within the reactant gas. The electrons can gain sufficient energy from the electric field caused by the potential difference so that when they collide with gas molecules in the reactant gas, gas-phase dissociation and ionization of the reactant gas occurs. Some of the reactant gas is then adsorbed on substrate 24 or a material region previously deposited thereon. In this way, deposition system 10 provides both sputtering and PECVD to deposit material regions on substrate 24.

Figure 6A:
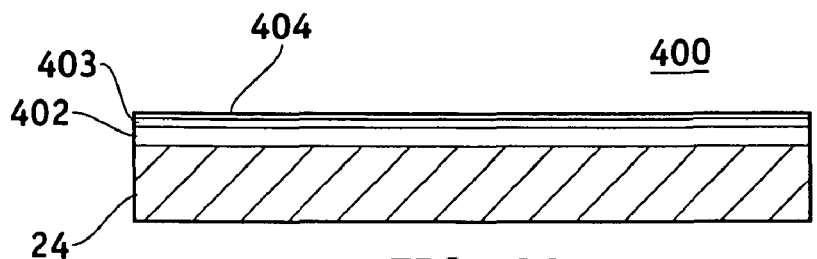
FIGS. 6a, 6b, 6c, and 6d are simplified sectional views of lead salt material regions formed with the chambers of FIGS. 1, 3a and 3b, and 5.

Turn now to FIG. 6a which shows an example of a structure 400 grown with deposition chamber 10. In this example, structure 400 includes substrate 24 onto which a lead selenide region 402 is sputtered as described above. It should be noted that region 402 could include lead sulphur (PbS), lead telluride (PbTe), or other material regions, but lead selenide (PbSe) is shown here for illustrative purposes. Next, a sensitized lead salt material region 403 is deposited thereon region 402 by using either sputtering or PECVD.

If sputtering is used to deposit material region 403, oxygen gas is introduced from gas line 79 into chamber 12. This can be done with or without the presence of a halogen gas, such as iodine. A dopant gas can also be provided if it is desired to make material region 403 p-type or n-type. The oxygen can be provided by one of the gas bottles in system 70 and the iodine gas can be provided by iodine gas source 110. The argon from gas line 73 is ionized, as discussed above, and directed towards target 21 where it causes material to be ejected therefrom. The ejected material from target 21 flows towards material region 402 on substrate 24 and interacts with the oxygen and iodine to form sensitized material region 403 thereon region 402.

The argon is injected near target 21 to reduce the amount of oxygen or iodine which would otherwise contaminate target 21. Similarly, the oxygen and iodine are injected near substrate 24 to increase the likelihood of it being incorporated with region 403. The oxygen and iodine are also injected near substrate 24 so that any oxygen or iodine not incorporated with region 403 is more likely to be outgassed through vacuum system 30.

During the sputtering operation, signals $S_{DCA}$ and $S_{DCB}$ can be provided by outputs 58 and 59 to heater 26 and electrode 19, respectively, to provide bias sputtering. In this way, the amount of chemical constituents from the sputtering gas and dopant gas incorporated into material region 403 can be controlled.

If PECVD is used to deposit material region 403, then electrode 27 is used to form the plasma in chamber 12 between it and substrate 24 as discussed above. Argon or another sputtering gas can be flowed into chamber 12 through gas line 73 and oxygen is flowed into chamber 12 through gas line 79. The sputtering gas can be flowed into chamber 12 to improve the uniformity of region 403. The PECVD deposition of region 403 can take place with or without iodine gas provided from iodine gas source 110. The temperature of substrate 24 is controlled with heater 26 and/or cooling line 25 to provide it with a desired deposition temperature. In this way, the deposition temperature can be adjusted to adjust the electrical and/or optical properties of material region 403.

In this embodiment, a seal coating material region 404 is then deposited on region 403 using PECVD, although it could be deposited using sputtering in other embodiments. Material region 404 should include a material that is impermeable to the outside atmosphere. Examples of seal coating materials include oxides, like silicon oxide (SiO), silicon nitride (SiN), and silicon oxynitride (SiON), among others. However, it can also include other materials, such as aluminum nitride or amorphous silicon. The particular choice of material for material region 404 will depend on the gases included in gas system 70. For example, silicon oxide can be formed from oxygen and silane, silicon nitride can be formed from silane and ammonia gas, silicon oxynitride can be formed from silane, oxygen, and ammonia gas, and amorphous silicon can be formed from silane.

Figure 2:
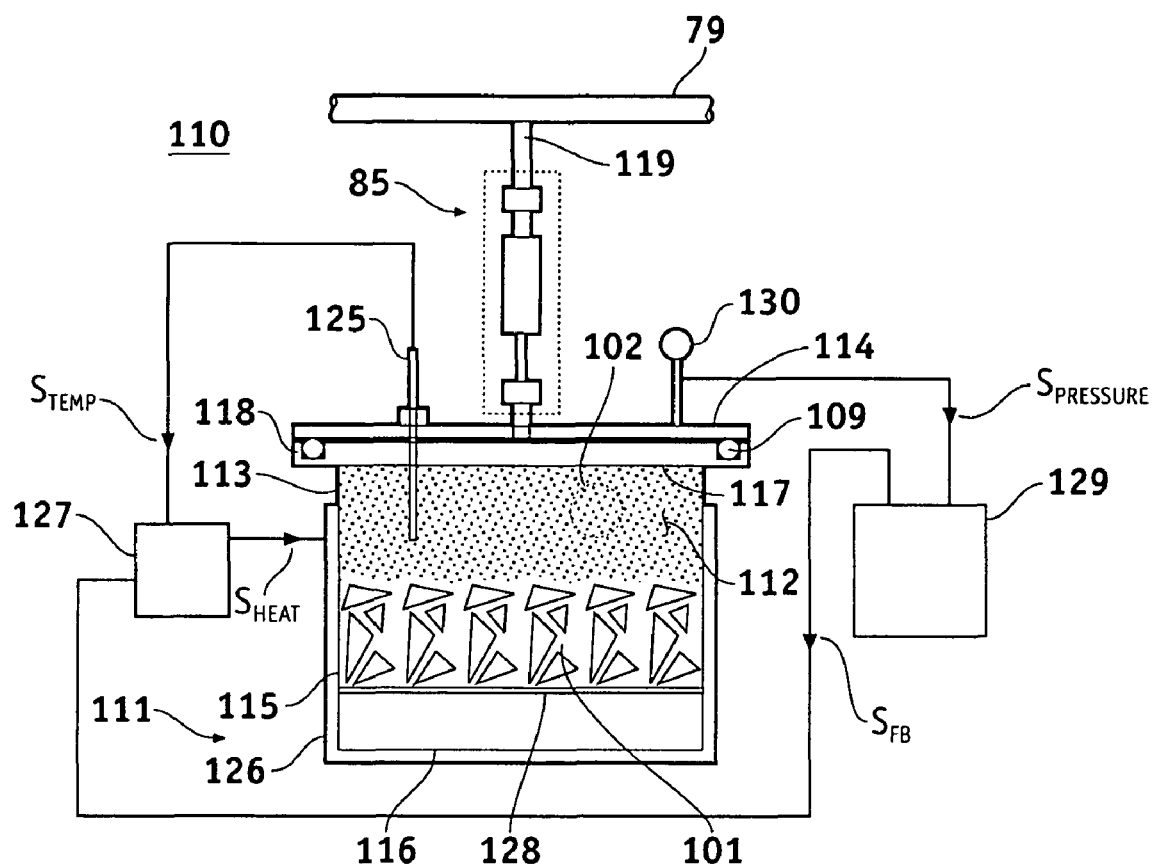
FIG. 2 is a simplified sectional view of an iodine gas source in accordance with the present invention.

FIG. 2 is a simplified sectional view of iodine gas source 110 shown in FIG. 1. Gas source 110 includes a chamber 111 with a chamber space 112 defined by a housing 113 and a lid 114. Housing 113 is generally cylindrical in shape with sidewall 115, although it can have other shapes. A bottom parametric edge of sidewall 115 is coupled to a bottom wall 116 and a top parametric edge is defined by an opening 117 which is surrounded by a lip 118. Lip 118 extends outwardly around the periphery of the top parametric edge of sidewall 115 and receives lid 114. Lid 114 is coupled to lip 118 near sidewall 115 so that it can engage lip 118 when lid 114 encloses chamber space 112. In this way, lid 114 can be moved between an open position to allow access to chamber space 112 and a closed position where it forms a seal with lip 117. The seal is facilitated by the positioning of an O-ring 109 around the periphery of lip 117. Hence, lid 114 allows reciprocal movement between a retracted position toward space 112 and an extended position away from space 112. When lid 114 is in its retracted position, a vacuum can be formed within chamber space 112.

Gas source 110 includes a shelf 128 positioned in chamber space 112 for holding solid iodine 101. A heater 126 is positioned to heat solid iodine 101 so that a portion of it transforms into iodine gas 102. In this example, heater 126 is positioned outside housing 113 near sidewall 115 and bottom wall 116, but it could be positioned elsewhere to provide heat to iodine 101. A temperature control system 127 is coupled to a thermocouple 125. Thermocouple 125 extends through lid 114 and into chamber space 112 so that it can measure the temperature therein of iodine gas 102. A pressure control system 129 also extends through lid 114 and into chamber space 112 so that it can monitor the pressure therein of iodine gas 102.

An end of a chamber gas outlet 119 extends through lid 114 so that it is in communication with chamber space 112 and an opposed end of chamber gas outlet 119 is in communication with gas line 79. Valve system 85 is coupled to chamber gas outlet 119 to control the flow of iodine gas between chamber space 112 and gas line 79. When valve system 85 is open, iodine gas 102 can flow into gas line 79 and when valve system 85 is closed, iodine gas 102 is blocked from leaving chamber space 112. Valve system 85 is also configured to prevent any gas in gas line 79 from undesirably flowing into chamber space 112. In this way, valve system 85 operates as a one-way valve.

In this embodiment, temperature control system 127 and pressure control system 129 are in communication with each other to provide a desired temperature and pressure to iodine gas 102 inside chamber 111. Hence, a desired amount of iodine gas 102 is formed from iodine 101. In operation, temperature control system 127 receives a temperature signal $S_{Temp}$ from thermocouple 125 and a feedback signal $S_{FB}$ from pressure control system 129. System 127 provides a heat signal $S_{Heat}$ to heater 126 in response to signals $S_{Temp}$ and $S_{FB}$. Pressure control system 129 receives a pressure signal $S_{Pressure}$ from pressure sensor 130 and provides signal $S_{FB}$ to temperature control system 127 in response. Signals $S_{Temp}$ and $S_{Pressure}$ indicate the temperature and pressure of iodine gas 102, respectively, in chamber space 112.

If the pressure of iodine gas 102 is too low as indicated by signal $S_{Pressure}$, then signal $S_{FB}$ indicates this condition to system 127. As a result, system 127 outputs signal $S_{Heat}$ to heater 126 so that it provides more heat to increase the temperature of iodine gas 102. In this way, the temperature and, consequently, the pressure of iodine gas 102 is increased to a desired value. Conversely, if the pressure of iodine gas 102 is too high as indicated by signal $S_{Pressure}$, then signal $S_{FB}$ indicates this condition to system 127. As a result, system 127 outputs signal $S_{Heat}$ to heater 126 so that it provides less heat to decrease the temperature of iodine gas 102. In this way, the temperature and, consequently, the pressure of iodine gas 102 is decreased to a desired value.

Figure 3A:
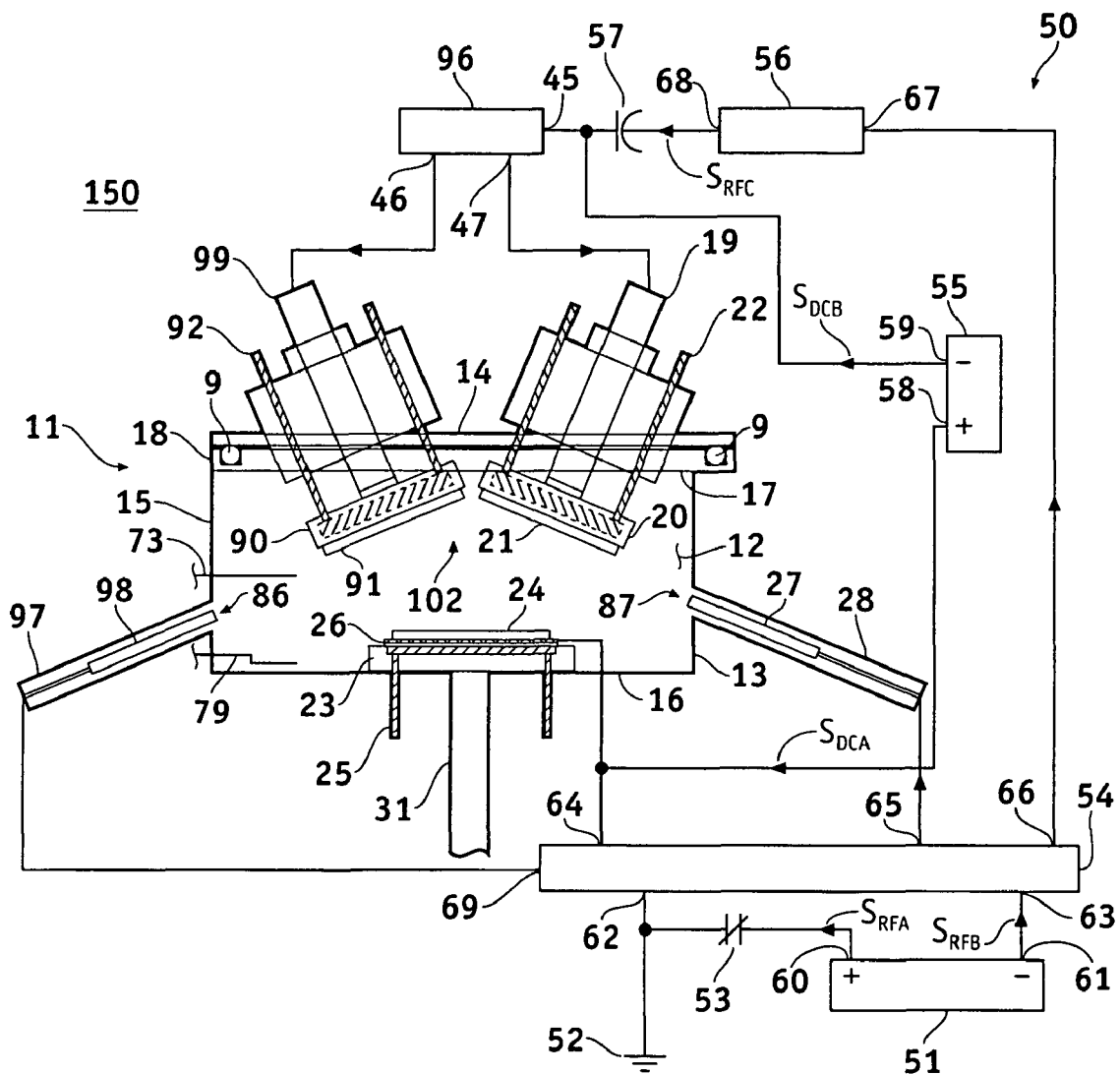
FIGS. 3a and 3b are simplified diagrams of a chamber in accordance with the present invention.
Figure 3B:
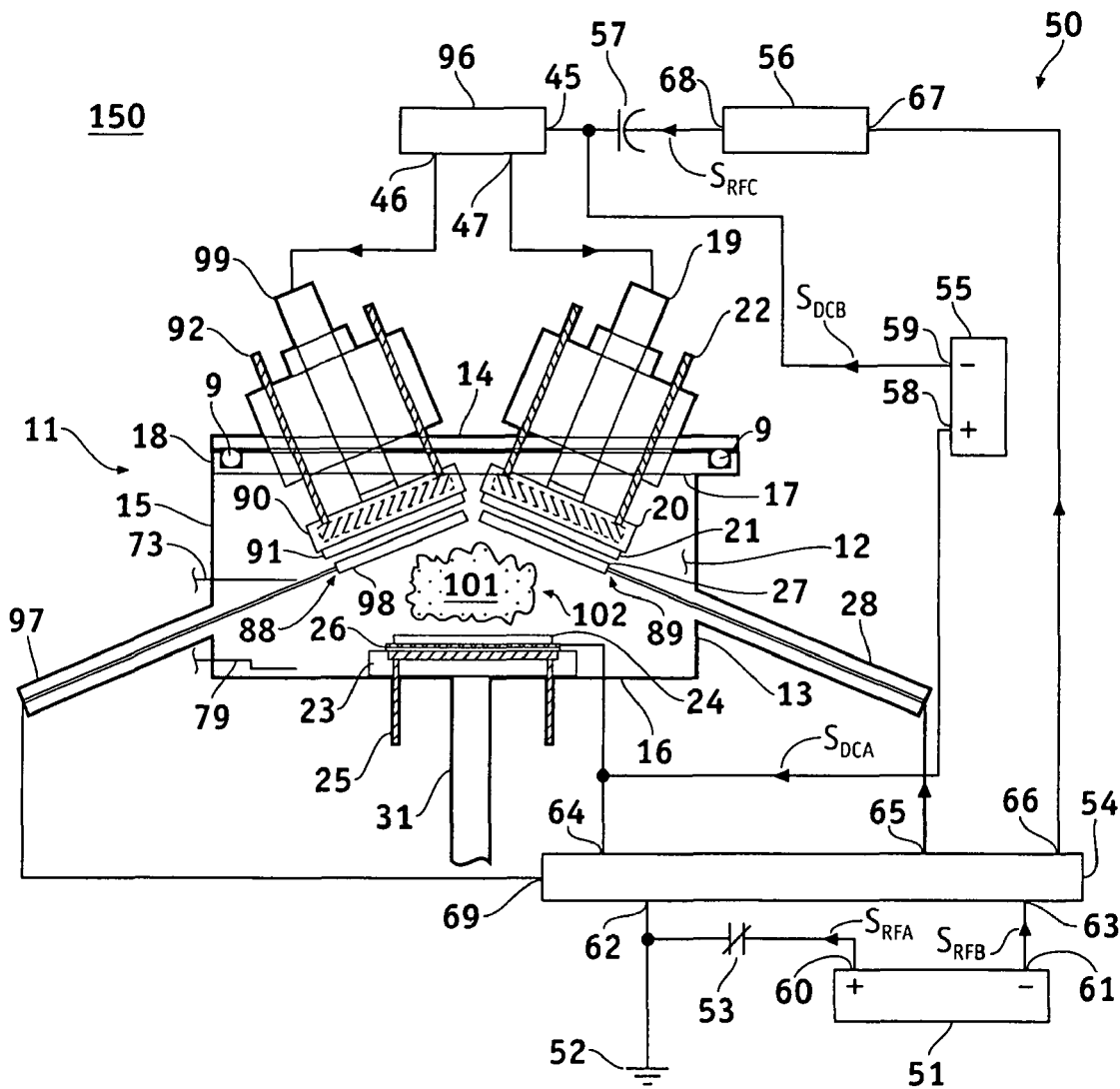

FIGS. 3a and 3b show simplified diagrams of a deposition system 150 in accordance with the present invention. It should be noted that vacuum system 30 and gas system 70 are not shown in FIGS. 3a and 3b for simplicity. In this embodiment, deposition system 150 includes two sputtering targets and two PECVD electrodes. System 150 similar to that described above in conjunction with FIG. 1.

System 150 further includes an electrode 99 which extends through lid 14 and into chamber space 12. A target holder 90 is coupled to electrode 99 so that it is carried in chamber space 12. In this example, electrical system 50 includes an RF power switch 96 with an input 45 coupled to output 68 of network 56 through capacitor 57. An output 47 of switch 96 is coupled to electrode 19 and an output 46 of switch 96 is coupled to electrode 99.

Target holder 90 carries a target 91 so that it faces downwardly towards bottom wall 16. In this example, targets 21 and 91 are at non-zero angles relative to substrate 24 although they could be parallel to it. Since targets 21 and 91 are at non-zero angles relative to substrate 24, it may be desired to rotate it so that the material regions deposited thereon are more uniform. A cooling line 92 extends through lid 14 and into chamber space 12. Inside space 12, cooling line 92 extends through target holder 90 and then back out of chamber space 12 through lid 14. Cooling line 92 can flow a coolant therethrough to adjust the temperature of target holder 90 and target 91 since holder 90 and target 91 are thermally coupled together. The coolant typically includes water, such as process chilled water, although it can include other coolants.

In accordance with the invention, an electrode 98 is positioned within reaction chamber 11. Electrode 98 is movable between a position 88 (FIG. 3b) between target 91 and substrate 24 in area 102 and a position 86 (FIG. 3a) away from target 91 and substrate 24. In this particular example, when electrode 98 is in position 86 away from target 21 and substrate 24, it is positioned in an electrode chamber 97. Electrode chamber 97 is coupled to sidewall 15 so that it opens up into chamber space 12. In this way, electrode 97 can be extended into or out of chamber space 12. In this particular example, electrode chamber 98 is positioned opposite electrode chamber 28, although it could be otherwise positioned. Electrode 98 is coupled to an output 69 of RF power switch 54 so that it can receive signals $S_{RFA}$ and $S_{RFB}$ from RF power supply 51 in a manner similar to electrode 27.

In accordance with the invention, targets 21 and 91 can include the same or different materials. For example, targets 21 and 91 can include the same or different lead salt materials. Hence, an advantage of deposition system 150 is that different lead salt material regions can be sputtered onto substrate 24. In another example, one of targets 21 and 91 can include a lead salt material and the other one can include a seal coating material, such as silicon (Si) or aluminum (Al). An advantage of this is that a lead salt material region can be sputtered onto substrate 24 and sensitized, then a seal coating material region can be sputtered thereon to protect the material regions between it and substrate 24 from the outside atmosphere. It should be noted that the seal coating material region can also be formed using PECVD as discussed above in conjunction with FIG. 1.

It should also be noted that deposition system 150 is shown as including two targets (i.e. targets 21 and 91) for illustrative purposes. However, system 150 can include more than two targets so that more than two different types of material regions can be deposited onto substrate 24. For example, system 150 can include three sputtering targets in which two of them include two different lead salt materials and the third target includes a material for seal coating, such as silicon to form sputtered amorphous silicon. In this way, two different sensitized lead salt material regions can be sputtered onto substrate 24 and then the seal coating material region can be sputtered thereon.

The operation of deposition system 150 is similar to the operation of deposition system 10 discussed above. Briefly, RF power switch 54 receives RF signals $S_{RFA}$ and $S_{RFB}$ at inputs 62 and 63, respectively, and provides these signals to electrodes 27 and 98, heater 26, and impedance matching network 56. For example, if it is desired to sputter a material region onto substrate 24, then electrodes 27 and 98 are moved to positions 87 and 86, respectively, and signal $S_{RFA}$ is provided to them so that they are at the reference potential defined by current return 52. Signal $S_{RFA}$ is also provided to heater 26 so that its potential is defined by current return 52. Signal $S_{RFB}$ is provided to network 56 where it is conditioned as described above in conjunction with FIG. 1 to provide signal $S_{RFC}$ to input 45 of RF power switch 96.

If portions of target 21 are to be sputtered onto substrate 24, then RF power switch 96 provides signal $S_{RFC}$ to electrode 19 through output 47 and electrode 99 is turned off by an appropriate signal at output 46. Hence, there is a potential difference between electrode 19 and heater 26 so that target 21 is sputtered. Similarly, if portions of target 91 are to be sputtered onto substrate 24, then RF power switch 96 provides signal $S_{RFC}$ to electrode 99 at output 46 and electrode 19 is turned off by providing the appropriate signal at output 47. Hence, there is a potential difference between electrode 99 and heater 26 so that target 91 is sputtered. It should be noted that electrodes 27 and 98 have potentials defined by current return 52, but they could have other potentials during sputtering.

If it is desired to use PECVD to deposit a material region onto substrate 24, then at least one of electrodes 27 and 98 are moved to positions 89 and 88, respectively, and signal $S_{RFB}$ is provided to at least one of them. For example, if electrode 27 is to be used to provide plasma 101, then signal $S_{RFA}$ is provided to electrode 98 from output 69 of RF power switch 54 and signal $S_{RFB}$ is provided to electrode 27 from output 65. Signal $S_{RFA}$ is provided to heater 26 from output 64 so that there is a potential difference between heater 26 and electrode 27 which provides plasma 101. Similarly, if electrode 98 is to be used to provide plasma 101, then signal $S_{RFA}$ is provided to electrode 27 from output 65 and signal $S_{RFB}$ is provided to electrode 98 from output 69. In this way, there is a potential difference between electrode 98 and heater 26 which provides plasma 101. Typically, electrodes 19 and 99 are provided with potentials so that they are electrically inactive during PECVD.

Electrodes 27 and 98 can also be used to preclean targets 21 and 91, respectively. By precleaning targets 21 and 91 before sputtering a material region onto substrate 24, it is less likely that undesired elements will be incorporated in the material region. This can be done when electrodes 27 and 98 are in corresponding positions 89 and 88. Target 21 can be precleaned by providing a potential difference between electrodes 19 and 27 so that the sputter gas is ionized and impacts the surface of target 21 to remove any impurities thereon. Similarly, target 91 can be precleaned by providing a potential difference between electrode 98 and 99 so that the sputter gas is ionized and impacts the surface of target 91 to remove any impurities thereon.

Figure 6B:
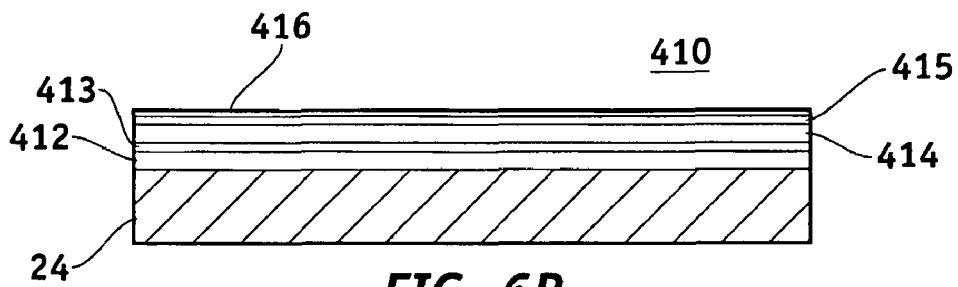

Turn now to FIG. 6b which shows an example of a structure 410 grown with deposition chamber 150 of FIGS. 3a and 3b. Here, it is illustrated how system 150 can be used to deposit two different lead salt material regions. In this example, structure 410 includes substrate 24 onto which a lead selenide region 412 is sputtered using target 21. It should be noted that region 412 can include lead sulphur (PbS), lead telluride (PbTe), or other material regions, but lead selenide (PbSe) is shown here for illustrative purposes. After region 412 is sputtered onto substrate 24, a sensitized material region 413 is positioned thereon by using either sputtering or PECVD, as discussed above in conjunction with FIG. 6a. After region 413 is formed, a lead sulfide material region 415 is sputter deposited on it using target 91.

A sensitized material region 416 is then deposited thereon by using either sputtering or PECVD, as discussed above in conjunction with FIG. 6a. A seal coating material region 416 is deposited on region 403 using PECVD, although it could be deposited by sputtering if a seal coating sputtering target is included therein chamber 11. Since deposition system 150 can be used to deposit two or more different lead salt material regions, it can be used to fabricate more complicated structures which include multiple regions of different lead salt materials. In general, the different lead salt materials are sensitive to different wavelengths of radiation which is useful for light sensing applications.

Figure 4A:
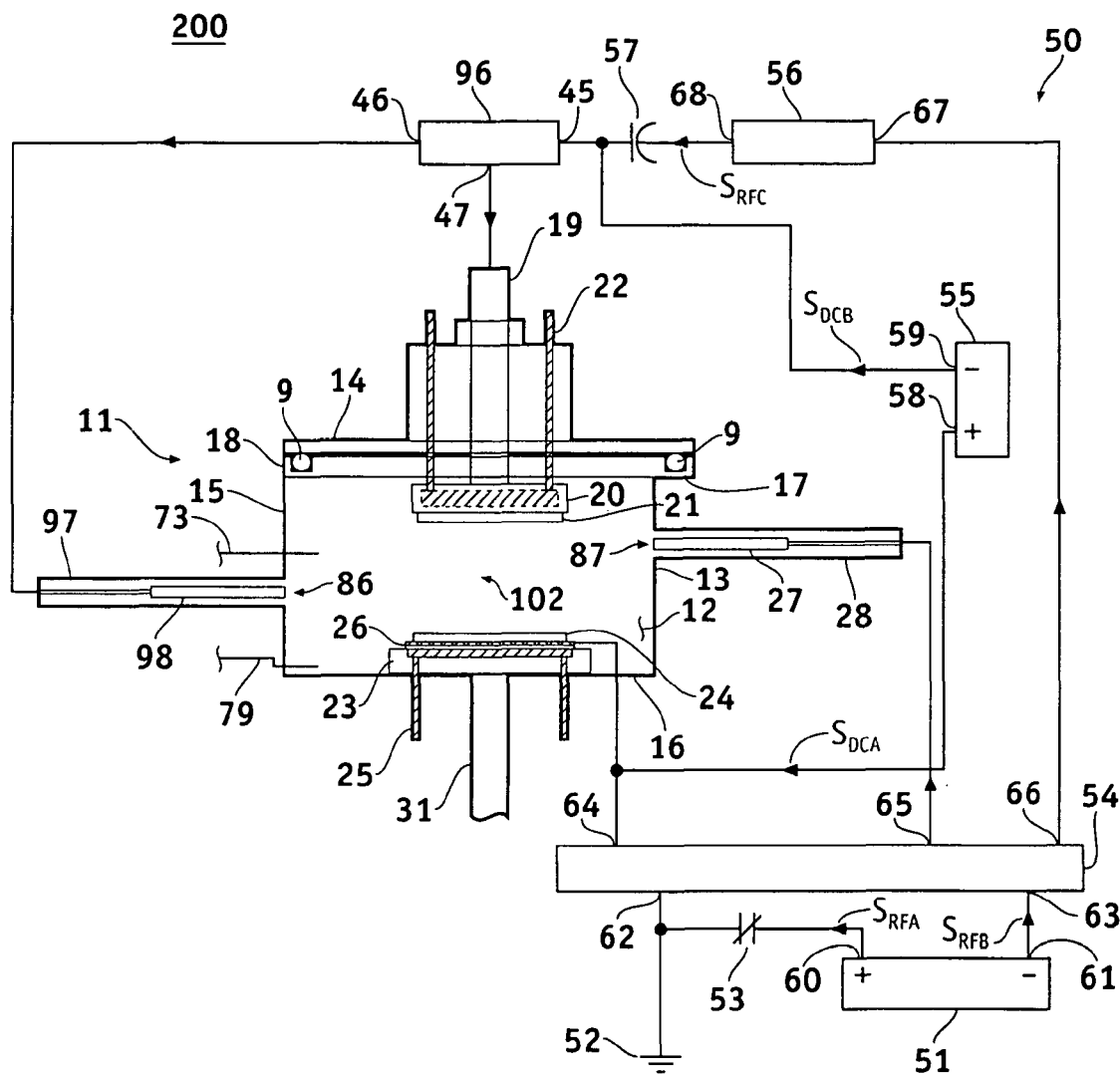
FIGS. 4a and 4b are simplified diagrams of another chamber in accordance with the present invention.
Figure 4B:
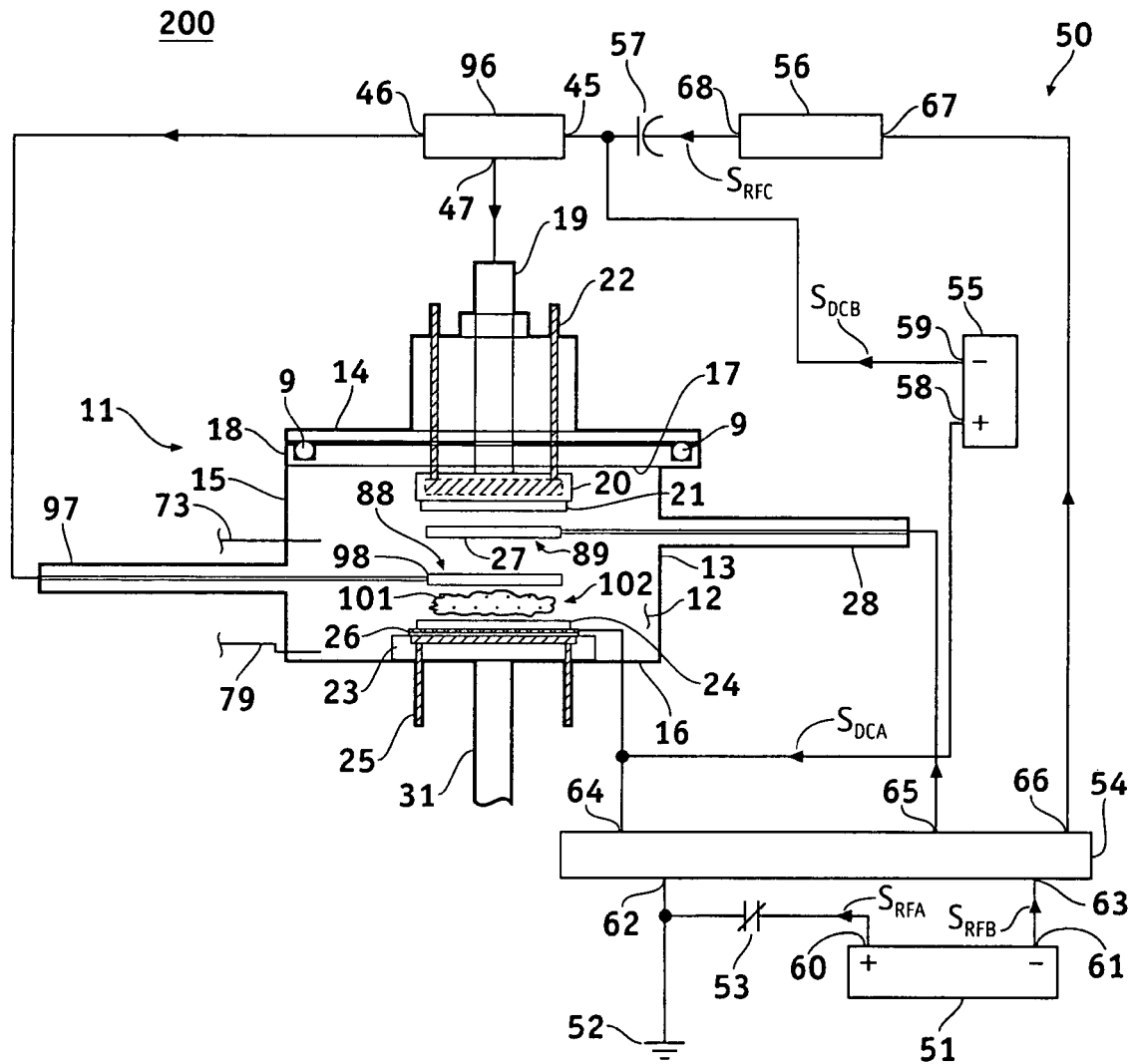

FIGS. 4a and 4b show simplified diagrams of a deposition system 200 in accordance with the present invention. It should be noted that vacuum system 30 and gas system 70 are not shown in FIGS. 4a and 4b for simplicity. In this embodiment, deposition system 200 includes one sputtering target as in FIG. 1 and two electrodes as in FIGS. 3a and 3b. Here, one electrode is used for PECVD and the other electrode is used to preclean the sputtering target if desired.

Deposition system 200 includes electrode 19, target holder 20, and target 21, as described above in conjunction with FIG. 1. Electrode 98 is positioned so that it is movable between position 88 between target 21 and substrate 24 and position 86 away from target 21 and substrate 24. Likewise, electrode 27 is movable between position 89 between target 21 and substrate 24 and position 87 away from target 21 and substrate 24. Electrodes 27 and 98 move substantially parallel to target 21 and substrate 24.

Deposition system 200 can be used to provide sputter and PECVD deposition in a manner similar to systems 10 and 150 discussed above. In the operation for sputtering, RF power supply 51 provides a potential difference between electrode 19 and substrate 24 by providing signals $S_{RFA}$ and $S_{RFB}$ to electrodes 19, 27, and 98 and heater 26 with RF power switch 54. Here, signal $S_{RFB}$ is provided to impedance matching network 56 where it is conditioned to provide signal $S_{RFC}$ to electrode 19 through output 47 of RF power switch 96. Switch 54 provides signal $S_{RFA}$ to heater 26 so that electrode 19 operates as a cathode and heater 26 operates as an anode. The sputtering occurs in the same way as described in conjunction with FIGS. 1, 3a, and 3b.

Deposition system 200 can also provide plasma enhanced chemical vapor deposition (CVD). This can be done in the following manner. Plasma 101 is generated by extending electrode 98 out from chamber 97 so that it is positioned between target 21 and substrate 24 in position 88 in area 102 (FIG. 4b). A potential difference is provided between electrode 98 and substrate 24 so that plasma 101 is formed therebetween. The potential difference is formed by providing signal $S_{RFA}$ to heater 26 and signal $S_{RFC}$ to electrode 98. Signal $S_{RFC}$ is provided to electrode 98 by output 46 of RF power switch 96.

In this embodiment, electrode 27 can also be used to preclean target 21. This can be done when electrodes 27 is in position 89 (FIG. 4b). Target 21 can be cleaned by providing a potential difference between electrodes 19 and 27 so that the sputter gas is ionized and impacts the surface of target 21 to remove any impurities thereon. In the operation for precleaning target 21, RF power supply 51 provides a potential difference between electrode 19 and electrode 27 by providing signals $S_{RFB}$ and $S_{RFA}$ to electrodes 19 and 27, respectively, through RF power switch 54. Here, signal $S_{RFB}$ is provided to impedance matching network 56 where it is conditioned to provide signal $S_{RFC}$ to electrode 19. Signal $S_{RFC}$ is conditioned by network 56 so that a desired amount of power is provided to electrode 19 through output 47 of RF power switch 96. Signal $S_{RFA}$ is made to be RF ground by current return 52 so that there is a potential difference between electrodes 19 and 27.

Figure 5:
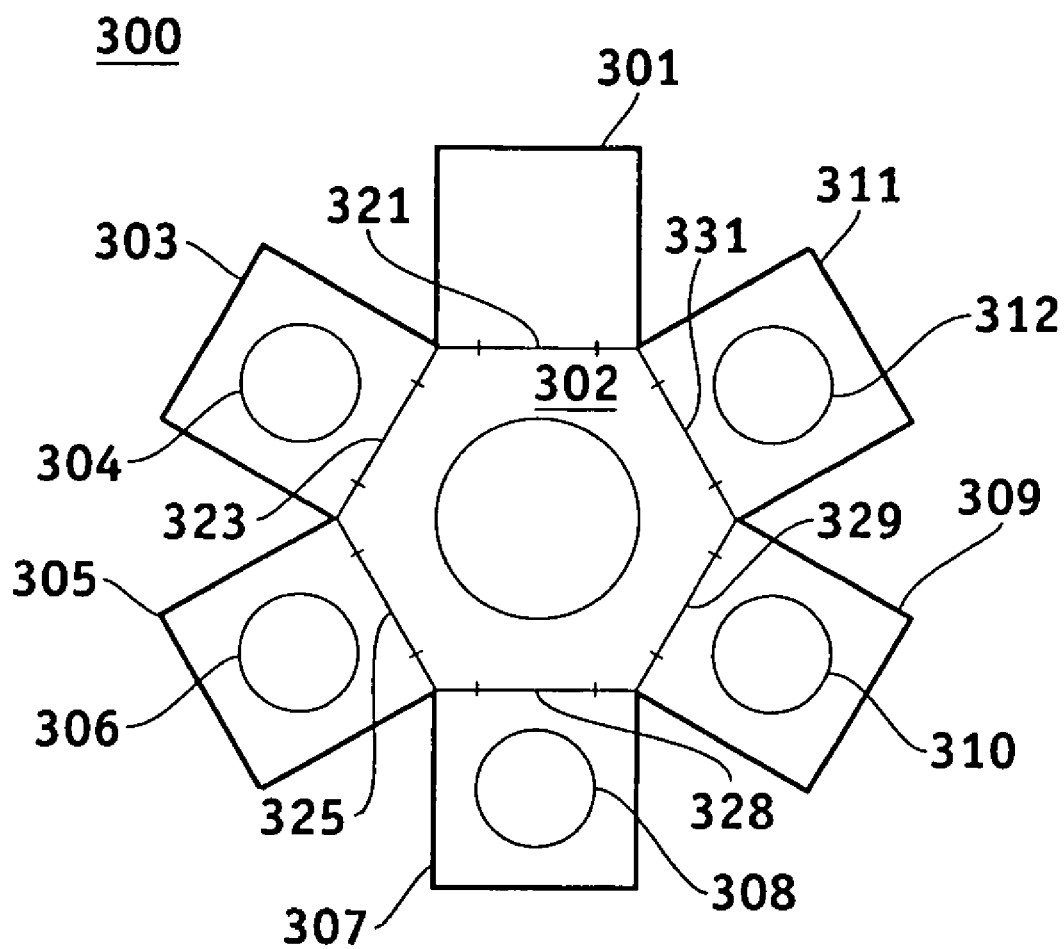
FIG. 5 is a simplified top view of a deposition chamber in accordance with the present invention.

FIG. 5 shows a simplified top view of a deposition system 300 in accordance with the present invention. It should be noted that deposition system 300 can have many different configurations which provide substantially the same result and the particular configuration shown in FIG. 5 is for illustrative purposes. Deposition system 300 includes a substrate transfer housing 302 with a plurality of openings (not shown). A substrate holder chamber 301 is coupled to an opening of substrate transfer housing 302. Substrate holder chamber 301 is separated from substrate transfer housing 302 by a door 321.

Substrate holder chamber 301 is used to store one or more substrates in which it is desired to form lead salt or other material regions thereon. Substrate transfer housing 302 is used to move the substrates from one position to another as will be discussed in more detail below. The movement of the substrate can be done with the use of a mechanical arm, for example, or another structure known in the art.

In this particular embodiment, sputtering systems 303, 307, and 311 are coupled to separate openings of substrate transfer housing 302. Sputtering systems 303, 307, and 311 are separated from substrate transfer housing 302 by doors 323, 328, and 331, respectively. Sputter systems 303, 307, and 311 include sputter apparatus 304, 308, and 312, respectively. Sputter apparatus 304, 308, and 312 can include structure similar to the sputter apparatus shown in FIGS. 1, 3, and 4 as discussed above.

Similarly, PECVD systems 305 and 309 are coupled to corresponding openings of substrate transfer housing 302. PECVD systems 305 and 309 are separated from substrate transfer housing 302 by corresponding doors 325 and 329. PECVD systems 305 and 309 include PECVD apparatus 306 and 310, respectively. PECVD apparatus 306 and 310 can include structure similar to the PECVD apparatus shown in FIGS. 1, 3, and 4 as discussed above. Each door 321, 323, 325, 328, 329, and 331 are movable between a first position away from substrate transfer housing 302 and a second position enclosing substrate transfer housing 302.

In operation, deposition system 300 has many of the advantages of deposition systems 10, 150, and 200 discussed above. For example, deposition system 300 provides both sputter and PECVD deposition. Hence, the substrates can be transferred between sputter systems 303, 307, and 311 and PECVD systems 305 and 309 to deposit the various material regions without undesirably exposing the substrate to the outside atmosphere in between depositions. Further, sputtering systems 303, 307, and 311 can have sputtering targets of different lead salt materials so that different lead salt material regions can be formed on the substrate.

Figure 6C:
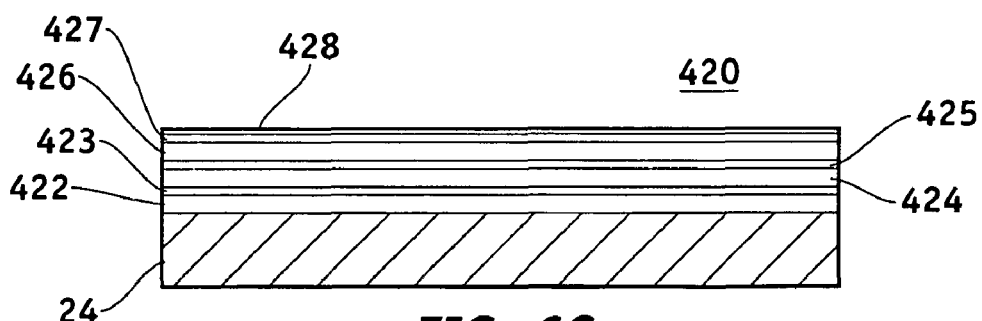

Turn now to FIG. 6c which shows a simplified sectional view of a structure 420 grown with deposition system 300 of FIG. 5. It should be noted that each sputter system can include one or more sputtering targets. In this particular example, however, sputtering systems 303, 307, and 311 include one sputtering target. Here, sputtering systems 303, 307, and 311 include a lead sulfide sputtering target, a lead telluride sputtering target, and a lead selenide sputtering target, respectively.

In this example, structure 420 includes substrate 24 onto which a lead sulfide region 422 is sputtered using sputter apparatus 304. After region 422 is sputtered onto substrate 24, a sensitized material region 423 is deposited thereon by using either sputtering or PECVD, as discussed above in conjunction with FIG. 6*a*. If sputtering is used to form region 423, then this can be done in sputtering apparatus 304. If PECVD is used to form region 423, then this can be done using PECVD apparatus 306.

After region 423 is formed, substrate 24 is moved from either sputtering system 303 or PECVD system 305 to sputtering system 307. In sputtering system 307, a lead telluride material region 424 is sputtered onto material region 423. A sensitized material region 425 is deposited thereon region 424 by using either sputtering or PECVD, as discussed above in conjunction with FIG. 6*a*. Again, if sputtering is used to form region 425, then this can be done in sputtering apparatus 308. If PECVD is used to form region 425, then this can be done using PECVD apparatus 310.

After region 425 is formed, substrate 24 is moved from either sputtering system 307 or PECVD system 309 to sputtering system 312. In sputtering system 312, a lead selenide material region 426 is sputtered onto material region 425. A sensitized material region 427 is deposited thereon region 426 by using either sputtering or PECVD, as discussed above in conjunction with FIG. 6*a*. Again, if sputtering is used to form region 427, then this can be done in sputtering apparatus 312. If PECVD is used to form region 427, then this can be done using PECVD apparatus 310.

In this example, a seal coating material region 428 is then deposited on region 427 using PECVD. Accordingly, material region 428 can be deposited using any of the PECVD systems in system 300. However, seal coating material region 428 can be deposited using sputtering. In this way, deposition system 300 can be used to fabricate more complicated structures which include multiple regions of different lead salt materials. In general, the different lead salt materials are sensitive to different wavelengths of radiation which is useful for light sensing applications. It should be appreciated that the movement of substrate 24 through system 300 depends on the desired layer structure and the layer structure shown in FIG. 6*c* is for illustrative purposes. The movement of substrate 24 through system 300 also depends on the desired throughput.

The throughput refers to the number of substrates that can be processed in a given amount of time. In system 300, more than one substrate can be processed simultaneously so that its throughput is increased. For example, while a lead salt material region is deposited on one substrate in sputter system 303, another substrate with a lead salt material region already deposited on it can be sensitized with PECVD system 305. Of course, other substrates can be processed in sputtering system 307 and PECVD systems 309 and 311 at the same time. The throughput can also be increased by depositing more than one material region in the same PECVD or sputtering system without moving substrate 24 through substrate transfer housing 302 between the two depositions. For example, a stack of a lead salt material region and insulating region can be deposited on substrate 24 using sputtering system 307.

Further, the movement of substrate 24 through system 300 is typically chosen so that the transit time of the substrate is reduced. For example, the transit time of substrate 24 between sputtering system 303 and PECVD system 305 is generally less than the transit time of substrate 24 between sputtering system 303 and PECVD system 309. However, in some instances, PECVD system 309 may be the only PECVD system in system 300 that is currently not being used. In this case, it may take less time to move the substrate to PECVD system 309 rather than wait for a closer PECVD system, such as PECVD system 305, to become available. Accordingly, it is typically desired to move substrate 24 through system 300 so that more depositions can occur in a given amount of time. In this way, the throughput of system 300 is increased.

Figure 6D:
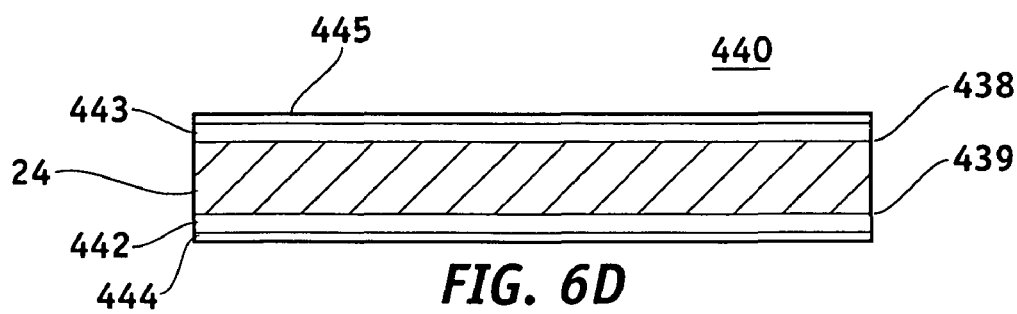

Turn now to FIG. 6*d* which shows a simplified sectional view of a structure 440 grown with deposition system 300 of FIG. 5. FIG. 6*d* illustrates that another advantage of system 300 is that both sides of substrate 24 can be coated with lead salt materials. Here, a sensitized lead salt material region is deposited on a surface 438 of substrate 24. This can be done as described above by using the various sputtering and/or PECVD systems included in deposition system 300. A seal coating material region 433 is then deposited thereon region 443 by using either sputtering or PECVD. Substrate 24 can then be moved to another sputter system in system 300 through substrate transfer housing 302.

During the transfer of substrate 24, it can be turned over to expose an opposed surface 439. A lead salt sensitized material region 442 is deposited on surface 439 of substrate 24. This can be done as described above by using the various sputtering and/or PECVD systems included in deposition system 300. A seal coating material region 444 is then deposited thereon region 442 by using either sputtering or PECVD. In this way, substrate can be coated on both surfaces 438 and 439 which is useful in some applications because there is more surface area to absorb more incident radiation. In some applications, regions 443 and 442 can include different lead salt materials so that one spectrum of radiation is absorbed near surface 438 and another spectrum of radiation is absorbed near surface 439.

Figure 7:
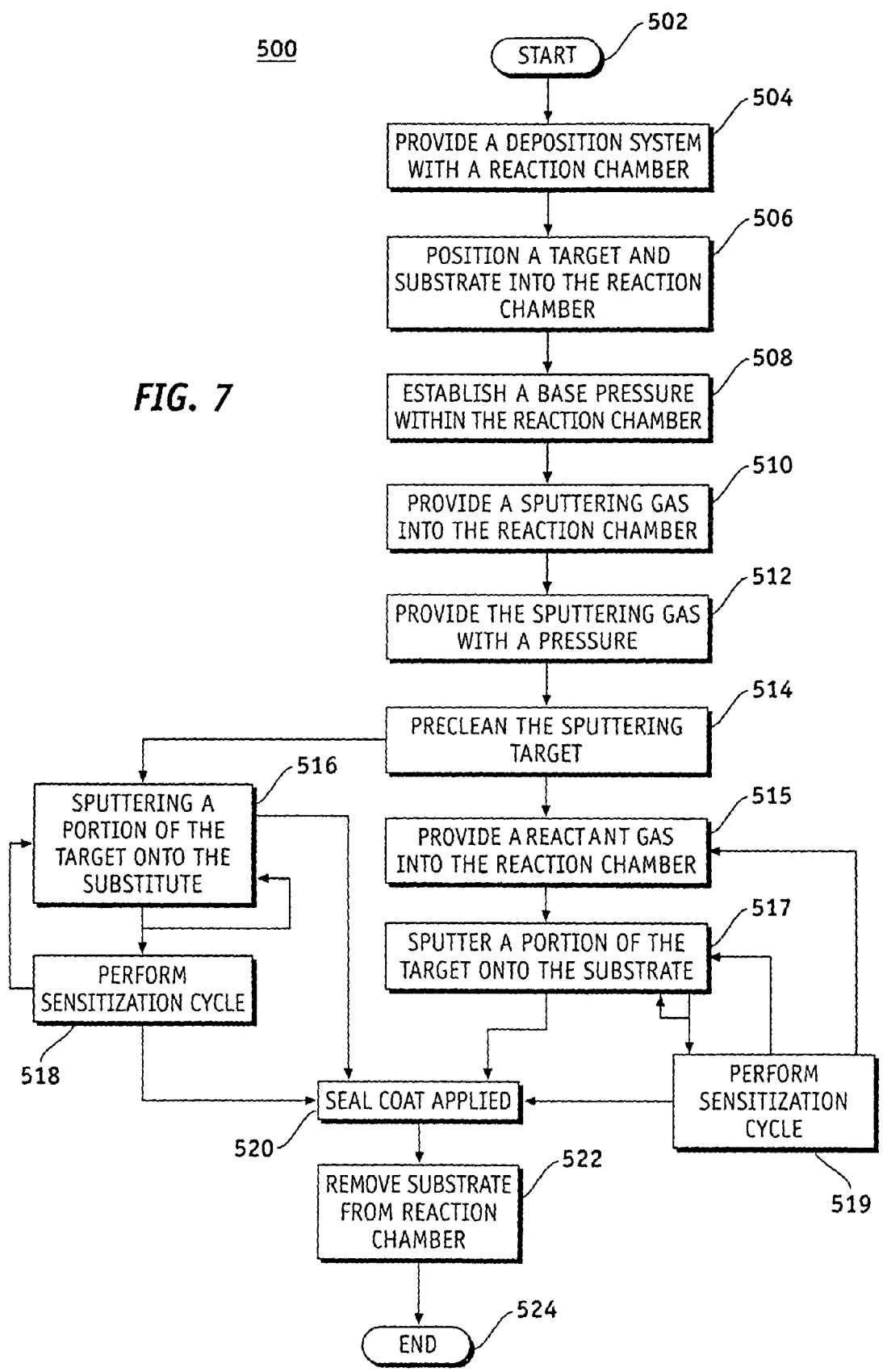
FIG. 7 is a simplified flow chart of a method of depositing a lead salt material region in accordance with the present invention.

FIG. 7 shows a method 500 of depositing a lead salt material region in accordance with the present invention. It should be noted that method 500 includes steps that can take place sequentially as discussed here or in a different order depending on the structure and properties of the desired device to be formed. It should also be noted that some of the steps are optional. At a start step 502, method 500 moves to a step 504 of providing a deposition system with a reaction chamber and a step 506 of positioning a substrate and a sputtering target into the reaction chamber. The deposition system is configured to deposit on the substrate separate material regions using sputtering and/or PECVD without undesirably exposing the substrate to the outside atmosphere between depositions.

The substrate can include a semiconductor material, such as silicon, or another material onto which it is desired to deposit a material region. The substrate can also include structures positioned thereon, such as solar cells or other devices. The sputtering target can include lead salt materials such as lead sulfide (PbS), lead selenide (PbSe), and lead telluride (PbTe). In some embodiments, more than one sputtering target of the same or different materials can be positioned in the reaction chamber. However, at least one target should be a lead salt sputtering target.

Method 500 includes a step 508 of providing a base pressure within the reaction chamber after it is sealed. The base pressure is chosen to at least partially remove the atmosphere from within the reaction chamber. A step 510 includes providing a sputtering gas in the reaction chamber. The sputtering gas can include argon or nitrogen, for example, or other gases typically used in sputtering. A step 512 includes providing the sputtering gas within the reaction chamber with a pressure. This can be done by controlling the flow rate of the sputtering gas into and out of the reaction chamber. The pressure is typically less than the pressure of the outside atmosphere, but it can be equal to or greater than the outside atmosphere.

In an optional step 514, at least one of the sputtering targets is precleaned to remove impurities or undesired elements from its surface. By precleaning the sputtering target, the likelihood of impurities or undesired elements being incorporated into the material region sputtered onto the substrate is reduced. From step 514, method 500 can move to a step 515 of providing a reactant gas into the reaction chamber. The reactant gas can include a sensitizing gas, such as oxygen, to sensitize the lead salt material region. The reactant gas can also include a halogen gas and/or a dopant gas if desired. The dopant gas can provide the sputtered material region with an n-type or p-type conductivity. In this way, chemical constituents from the reactant gas can be incorporated into the sputtered lead salt material region in situ (i.e. reactive sputtering).

From step 515, method 500 includes a step 517 of sputtering a portion of the lead salt sputtering target onto the substrate or material regions previously deposited thereon to form a first lead salt material region. In one example, method 500 can then move to an optional step 520 of depositing a seal coating region onto the first lead salt material region. In another example, method 500 can repeat step 517 with the same or different materials to provide a desired layer structure on the substrate. After the desired layer structure has been deposited, method 500 can then move to step 520.

The seal coating material region protects the material regions between it and the substrate from the outside atmosphere so that undesired elements are less likely to be incorporated therein. The seal coating material region can be deposited using sputtering or PECVD. If sputtering is used to deposit the seal coating material region, then suitable coating target should be positioned in the deposition system in step 506 along with the other target(s). In one example, the suitable coating target can include aluminum (Al), so that the seal coating material region can include aluminum nitride (AlN). If a silicon target is used as the coating target, then the seal coating material region can include silicon oxide, silicon nitride, silicon oxynitride, or amorphous silicon, depending on which gases are flowed into the reaction chamber. If PECVD is used to deposit the seal coating material region, then the appropriate gases are flowed into the reaction chamber.

In still another example, step 517 can move to a step 519 of performing a sensitization cycle. The sensitization cycle includes using PECVD to oxidize the uppermost portion of the first lead salt material region. After step 519, method 500 can move to optional step 520 of depositing the seal coating material region. After step 519, method 500 can also move to step 517 or to step 515. In any of these examples, method 500 moves from optional step 520 to a step 522 of removing the substrate with the material regions deposited thereon from the reaction chamber. This can be done by making the pressure within the reaction chamber substantially equal to the pressure outside the reaction chamber so that it can be opened up. Method 500 then ends with a step 524.

In another embodiment, method 500 can move from step 514 to a step 516 of sputtering a portion of the lead salt sputtering target onto the substrate or material regions previously deposited thereon to form the first lead salt material region. Step 516 can be repeated with the same or different materials to provide a desired layer structure on the substrate. From step 516, method 500 can move to step 520 directly or through a step 518 of performing a sensitization cycle. Here, step 518 is similar to step 519 discussed above. From step 518, method 500 can then move to optional step 520 of depositing the seal coating material region onto the first lead salt material region or the regions subsequently deposited thereon. After step 520, as above, method 500 moves to step 522 of removing the substrate, with the material regions deposited thereon, from the reaction chamber. Method 500 then ends with step 524.

It should be noted that during either of steps 518 and 519, the temperature of the substrate can be adjusted after steps 516 and 517, respectively. The temperature of the substrate at which the various depositions takes place affects the electrical and/or optical properties of the material regions deposited. Further, the sputtering in steps 515 and 516 can be done in many different ways. For example, it can be done using RF sputtering with or without a DC bias (i.e. bias sputtering). It can also be done using magnetron or reactive sputtering.

Method 500 is particularly useful for depositing a lead salt material region onto a silicon substrate, although it can be useful for depositing the lead salt material region onto other substrates such as glass. Method 500 is also useful for sensitizing the lead salt material region. Depositing the lead salt material region onto silicon has been a problem using conventional deposition methods because it may not adhere to the silicon substrate properly. If the lead salt material does not adhere properly, then the yield of devices will be low and the costs will be high. Another problem is that it is difficult to control the composition of the deposited lead salt material using conventional methods. As a result, the composition of the lead salt material region tends to be different from one deposition to another. Further, using conventional methods, the sensitization of the lead salt material regions often leads to undesirable differences in resistivity from one lead salt material region to another.

In method, 500 these problems are at least partially solved for several reasons. One reason is that the sputtered lead salt material region properly adheres to the silicon substrate. Further, the lead salt material region can be conveniently sensitized during sputtering or by using PECVD by introducing oxygen into the reaction chamber in a controlled manner. The composition of the sputtered lead salt material region can be better controlled since it is sputtered in a reaction chamber where it is easy to control the atmosphere therein. As a result, the various chemical constituents that come into contact with the lead salt material region can be better controlled. The chemical constituents can undesirably become incorporated into the lead salt material region to change its composition. The electrical and/or optical properties of the lead salt material depends on the composition, so if the composition changes then these will too. A further, advantage is that the sputtered lead salt material region can be conveniently seal coated so that its resistivity is more stable as a function of time.

The present invention is described above with reference to a preferred embodiment. However, those skilled in the art will recognize that changes and modifications may be made in the described embodiment without departing from the nature and scope of the present invention. Various changes and modifications to the embodiment herein chosen for purposes of illustration will readily occur to those skilled in the art. To the extent that such modifications and variations do not depart from the spirit of the invention, they are intended to be included within the scope thereof.

Having fully described the invention in such clear and concise terms as to enable those skilled in the art to understand and practice the same.

Having fully described the invention in such clear and concise terms as to enable those skilled in the art to understand and practice the same, the invention claimed is:

1. A deposition system, said deposition system comprising in combination:
 a) a vacuum reaction chamber;
 b) an immovable disc shaped holder having a perimeter and located within said chamber for supporting and heating a substrate of silicon, said holder including an imperforate substrate supporting surface defined by the perimeter of said holder;
 c) a heater for heating the substrate;
 d) apparatus located within said chamber, said apparatus being adapted to direct material from a target towards the substrate;
 e) an electrode movable within said chamber to a first position toward said holder for shielding the substrate and to a second position away from said holder to expose the substrate;
 f) a source for RF power;
 g) a RF transfer switch for applying RF power from said source of RF power;
 h) an impedance matching network interconnecting said RF transfer switch with a further electrode within said chamber; and
 i) a first source of vacuum for creating a first level of vacuum within said chamber and a second source of vacuum for creating a second level of vacuum within said chamber.

2. The deposition system set forth in claim 1 including reactants deposited in said reaction chamber.

3. The deposition system set forth in claim 2 wherein said reactants include dopants for making regions of the lead salt material p-type or n-type.

4. The deposition system set forth in claim 3 wherein said dopants include oxygen.

5. The deposition system set forth in claim 3 wherein said dopants includes halogen gases.

6. The deposition system set forth in claim 5 wherein the halogen gas is selected from the group consisting of iodine, fluorine, bromide and chlorine.

7. The deposition system set forth in claim 5 wherein the exposure of lead salt material of the substrate to a halogen gas is in the presence of oxygen.

8. The deposition system set forth in claim 1 including means for coating the lead salt material on the substrate with a seal coating material.

9. The deposition system set forth in claim 1 wherein the material of the substrate is selected from a group consisting of silicon (Si), silicon oxide (SiO) and silicon nitride (SiN).

10. The deposition system set forth in claim 1 wherein the lead salt material is selected from a group consisting of lead sulfide (PbS), lead selenide (PbSe) and lead telluride (PbTe).

11. The deposition system set forth in claim 7 including means for raising the temperature within said reaction chamber a range in excess of 300° C.

12. The deposition system set forth in claim 4 including means for controlling the temperature within said reaction chamber.

13. The deposition system set forth in claim 1 including means for controlling the pressure within said reaction chamber.

14. The deposition system set forth in claim 1 including a cooling line extending into and out of said reaction chamber to cool the substrate.

15. The deposition system set forth in claim 1 including a cooling line extending into and out of said reaction chamber to cool the target.

16. The deposition system set forth in claim 15 including a cooling line extending into and out of said reaction chamber to cool the substrate.

17. The deposition system set forth in claim 1 including a vacuum system for controlling the pressure within said reaction chamber.

18. The deposition system set forth in claim 1 including a pressure sensor for determining the pressure within said reaction chamber.

19. The deposition system set forth in claim 1 including a source of sputtering gas for injection into said reaction chamber.

20. The deposition system set forth in claim 19 wherein the sputtering gas is selected from the group consisting of argon (An) and neon (Ne).

21. The deposition system set forth in claim 1 including a source of gas used for growth.

22. The deposition system set forth in claim 21 wherein the gas used for growth is selected from the group consisting of silane, nitrous oxide and ammonia.

23. The deposition system set forth in claim 1 including a source of gas for doping.

24. The deposition system set forth in claim 23 wherein the gas used for doping is selected from the group consisting of phosphine ($Ph_3$) for n-doping, diborne ($B_2H_6$) for p-doping, trimethylphosphite (TMP) and trimethylborate (TMB).

25. The deposition system set forth in claim 1 including means for injecting oxygen into said reaction chamber near the substrate, means for injecting iodine gas into said reaction chamber near the substrate, and means for directing argon gas towards the target.

26. The deposition system set forth in claim 8 wherein the seal coating is material selected from the group consisting of silicon oxide (SiO), silicon nitride (SiN) and silicon oxynitride (SiON).

27. The deposition system set forth in claim 8 wherein the seal coating material is selected from the group consisting of aluminum (Al) and aluminum nitride (AlN).

* * * * *